US006864567B2

(12) United States Patent
Yu

(10) Patent No.: US 6,864,567 B2
(45) Date of Patent: Mar. 8, 2005

(54) BASE OF LED

(76) Inventor: San-Hua Yu, 3F, No. 117, Yan-Shou Road, Tu Cheng, Taipei Hsien (TW)

( * ) Notice: Subject to any disclaimer, the term of this patent is extended or adjusted under 35 U.S.C. 154(b) by 0 days.

(21) Appl. No.: 10/438,831

(22) Filed: May 16, 2003

(65) Prior Publication Data
US 2004/0173804 A1 Sep. 9, 2004

(30) Foreign Application Priority Data

Mar. 6, 2003 (TW) .................................. 92203401 U

(51) Int. Cl.[7] ............................................. H01L 33/00
(52) U.S. Cl. ...................... 257/676; 257/675; 257/722; 361/707; 361/709; 361/710; 361/717
(58) Field of Search ................................ 257/675, 676, 257/713, 722; 361/707, 709, 710, 717–719

(56) References Cited

U.S. PATENT DOCUMENTS 3,676,668 A * 7/1972 Collins et al. .............. 313/499
6,407,411 B1 * 6/2002 Wojnarowski et al. ......... 257/99
6,561,680 B1 * 5/2003 Shih ........................... 362/294
6,583,447 B2 * 6/2003 Wang et al. ................. 257/99
6,710,373 B2 * 3/2004 Wang ........................... 257/79

* cited by examiner

Primary Examiner—Bradley Baumeister
(74) Attorney, Agent, or Firm—Troxell Law Office, PLLC

(57) ABSTRACT

A base of LED includes a negative pole seat and a positive pole seat. The negative pole seat is made of conductive material with a flat negative pole plate at a lower outer side thereof, an integral negative pole body at an inner side thereof, multiple upright negative pole seat grooves at two lateral sides thereof and a negative pole recess at the top thereof respectively. The positive pole seat also is made of conductive material with a flat positive pole plate at the lower outer side thereof, an integral positive pole body at the inner side thereof, multiple seat grooves extending upright from the bottom at two lateral sides thereof. A crystal grain is located at the negative pole recess and a connecting wire at both ends thereof joined to the positive pole seat and the crystal grain and the negative pole plate and the positive pole plate are adhered to circuit of a circuit board to form a close circuit.

7 Claims, 3 Drawing Sheets

BASE OF LED

BACKGROUND OF THE INVENTION

1. Field of the Invention

The present invention relates to a base of a light emitting diode (LED) and particularly to a base of LED, which can provide better heat dissipation and be capable of adapting with a circuit board fabrication.

2. Description of Related Art

It is quite often that the LED (Light Emitting Diode) is found in electronic products and the LED is widely utilized for ordinary light signals because it provides a function of signaling or indication. Smallness, low power consumption and sufficient illumination are reasons why the LED plays an indispensable role.

The surface mounting technology (SMT) is popularly adopted in the field of electronics since recent years so that it is necessary for the LED to comply with SMT during the LED being designed. Besides, heat is generated once the LED is under operation and it is worth us to care how the heat is guided out because electronic components loose function of indication in case of the LED becoming damaged.

SUMMARY OF THE INVENTION

A primary object of the present invention is to provide a base of LED, which includes a negative pole seat and a positive pole seat. The negative pole seat is made of conductive material with a flat negative pole plate at a lower outer side thereof, an integral negative pole body at an inner side thereof, multiple upright negative pole seat grooves at two lateral sides thereof and a negative pole recess at the top thereof respectively. The positive pole seat also is made of conductive material with a flat positive pole plate at the lower outer side thereof, an integral positive pole body at the inner side thereof, multiple seat grooves extending upright from the bottom at two lateral sides thereof. A crystal grain is located at the negative pole recess and a connecting wire at both ends thereof joined to the positive pole seat and the crystal grain and the negative pole plate and the positive pole plate are adhered to circuit of a circuit board to form a close circuit.

BRIEF DESCRIPTION OF THE DRAWINGS

The present invention can be more fully understood by reference to the following description and accompanying drawings, in which.

DETAILED DESCRIPTION OF THE PREFERRED EMBODIMENT

Figure 1:
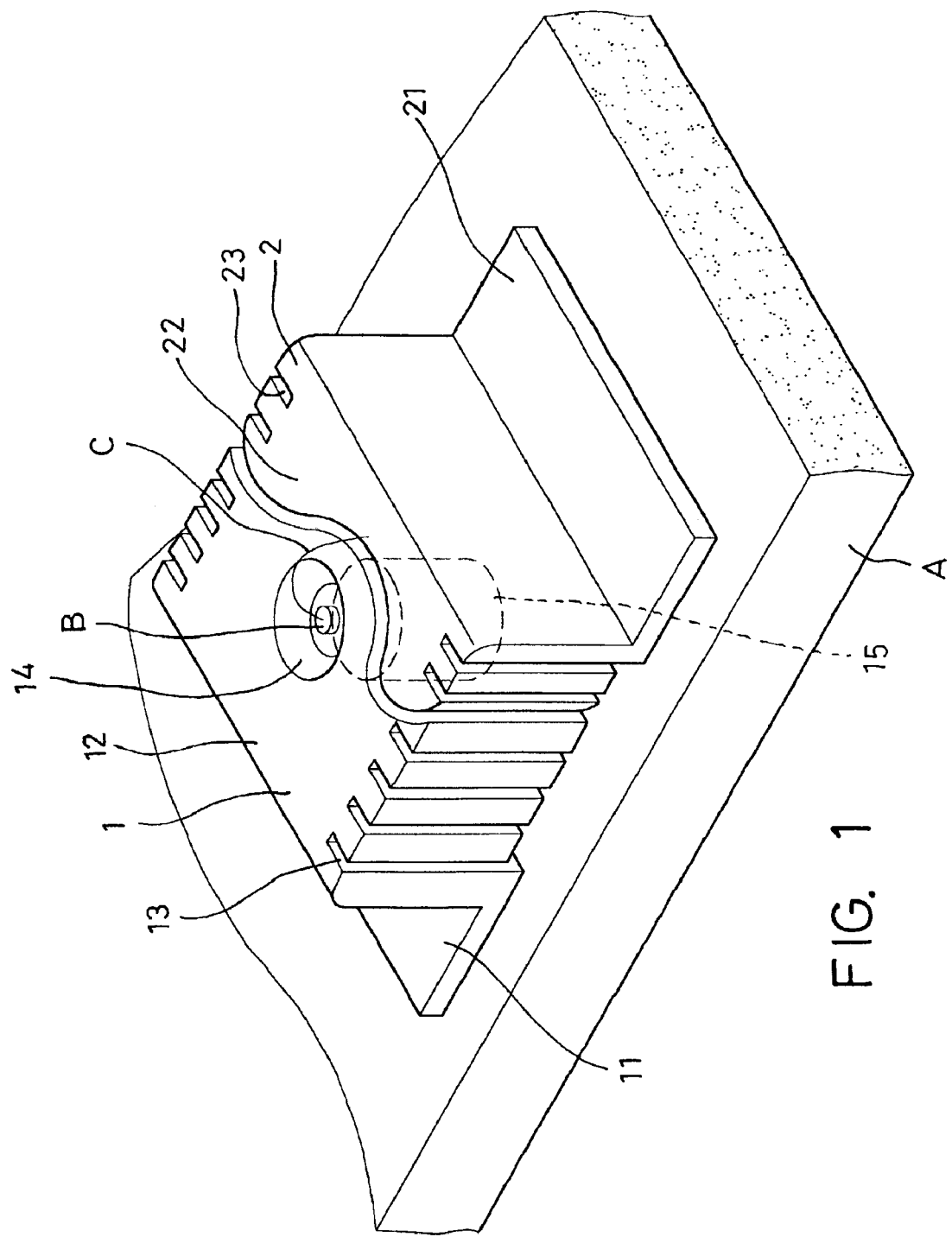
FIG. 1 is a perspective view of a base of LED according to the present invention.
Figure 2:
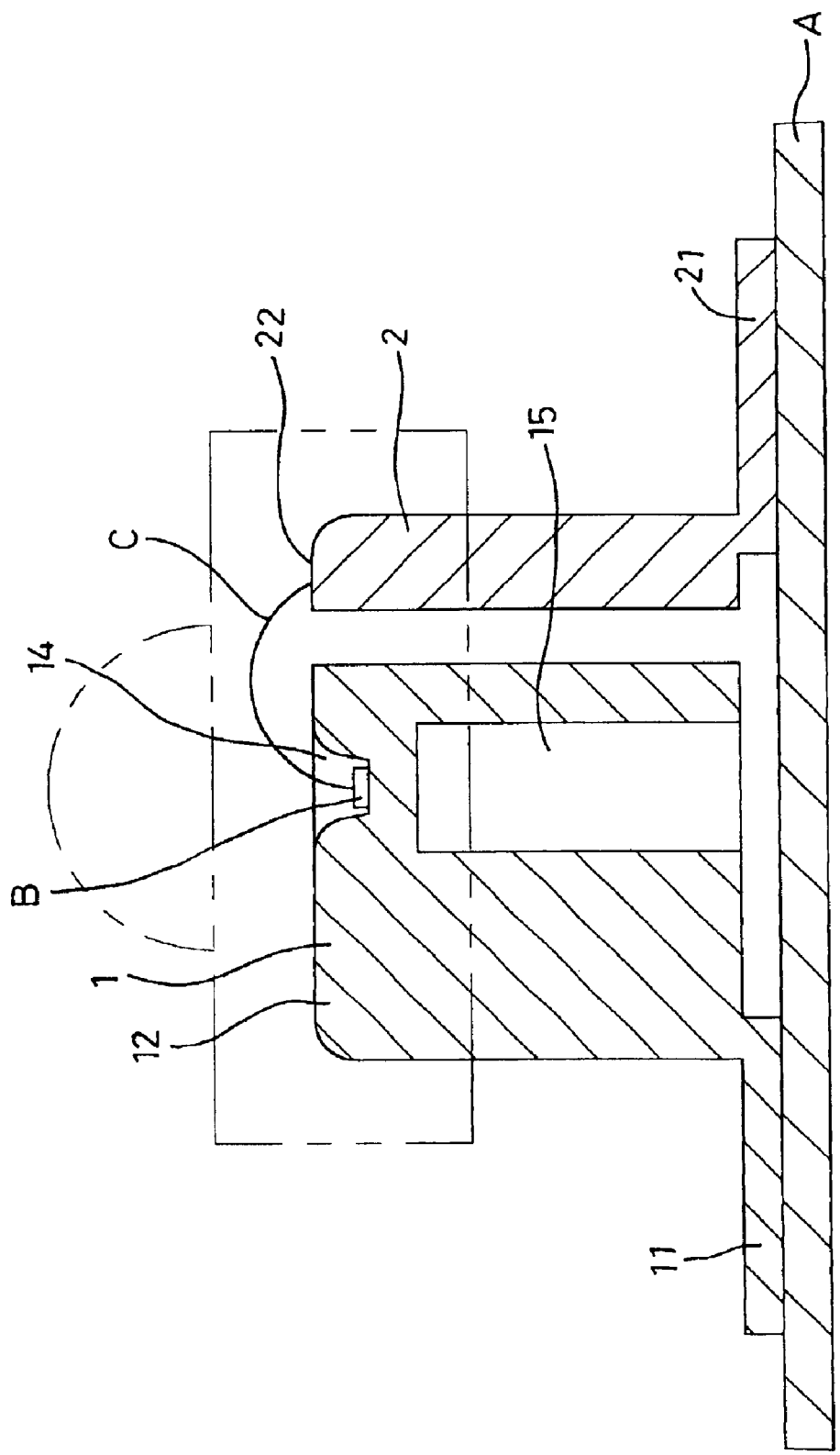
FIG. 2 is a sectional view of FIG. 1.
Figure 3:
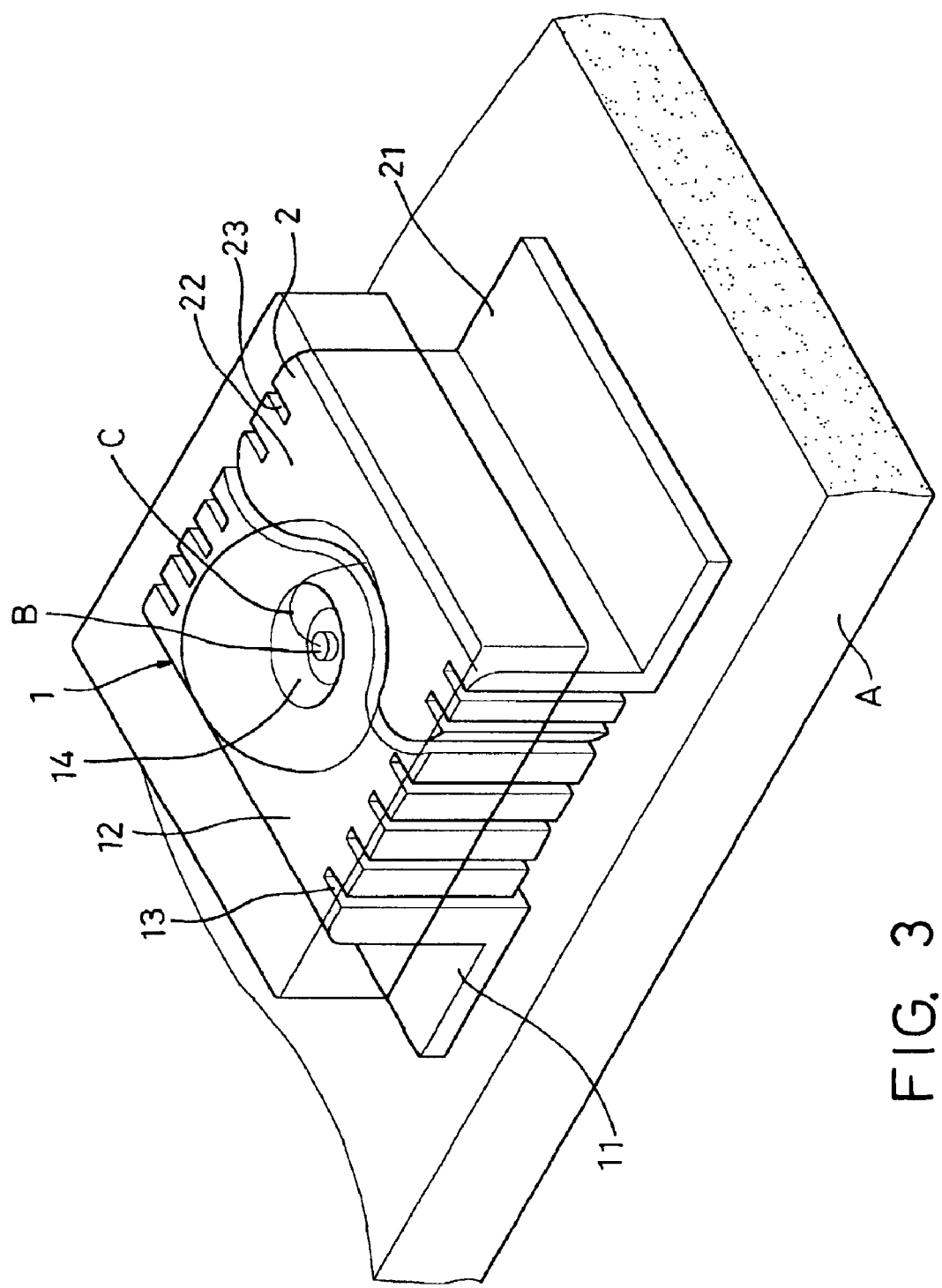
FIG. 3 is a perspective view illustrating the base according to the present invention with the LED.

Referring to FIGS. 1 to 3, basically, a base of LED according to the present invention is capable of being attached to a circuit board A and placed with a crystal grain (which also can be called solid crystal or chip) and a connecting wire C. The base of LED includes a negative pole seat 1 and a positive pole seat 2.

Wherein, the negative pole seat 1 is made of conductive material and has a section of flat negative pole plate 11 at a side thereof being attached to the circuit board A. The negative pole seat 1 further extends upward an integral negative pole body 12 and the negative pole body 12 at the bottom thereof is higher than the negative pole plate 11 with multiple upright negative pole grooves 13 at two lateral sides thereof. Besides, in order to receive the solid crystal, a negative pole seat recess 14 is provided at the top of the negative pole body 12 and a lower blind hole 15 is provided at the bottom of the negative pole body 12 as shown in FIG. 2 corresponding to the negative seat recess 14 to facilitate heat dissipation. The negative pole body 12 has a side opposite to the positive base 2 with a flat shape or a curvy shape.

The positive pole seat 2 is also made of conductive material and extends outward a section of flat positive pole plate 21 at the bottom thereof. The positive pole seat 2 further extends upward an integral positive pole body 22 and the positive pole body 22 at the bottom thereof is higher than the positive pole plate 21 with multiple upright positive pole grooves 23 at two lateral sides thereof. Further, the positive pole body 22 has a side opposite to the negative pole seat 1 with a flat shape or a curvy shape.

In fact, the base of LED according to the present invention can be made by way of pre-forming to constitute the negative pole seat 1 and the positive pole seat 2 with a small part of intersection at bottoms thereof being joined to each other. The small part of intersection can be separated by way of cutting after the solid crystal being placed and the soldering wire being glue-sealed.

With reference to FIGS. 1 to 3 again, while in use, the crystal grain B is located at the negative pole seat recess 14 and then the connecting wire C at the both ends thereof is joined to tops of the crystal grain B and the positive pole body 2 to form a state of close circuit.

Once the negative pole plate 11 and the positive pole plate 21 are adhered to the circuit board A, it is complete to mount the base of LED according to the present invention to the circuit board. Due to the negative pole body 12 and the positive pole body 22 at the lower parts thereof spacing apart from the circuit board, there is an effect of ventilation and the heat can be guided out by way of heat transmission via the negative pole grooves 13 and the positive pole grooves 23 to enhance the purpose of heat dissipation. Besides, the negative pole hole 15 under the crystal grain B also can enhance the effect of cooling.

Therefore, it is appreciated that the base of LED according to the present invention is capable of being attached to the circuit board easily and obtaining more desirable heat dissipation than that done by the conventional base of LED.

While the invention has been described with reference to a preferred embodiment thereof, it is to be understood that modifications or variations may be easily made without departing from the spirit of this invention, which is defined by the appended claims.

What is claimed is:

1. A base of an LED, comprising:
   a negative pole seat made of conductive material, with a flat negative pole plate at a lower outer side thereof, and having an integral negative pole body at an inner side thereof, a plurality of upright negative pole seat grooves at two lateral sides thereof and a negative pole recess at a top thereof;
   a positive pole seat made of conductive material, with a flat positive pole plate at a lower outer side thereof, and having an integral position pole body at an inner side thereof, a plurality of seat grooves extending upright from a bottom thereof at two lateral sides thereof;

wherein, when a crystal grain is located at the negative pole recess and a connecting wire at both ends thereof joined to the positive pole seat and the crystal grain with the negative pole plate and the positive pole plate being adhered to circuit of a circuit board, a close circuit is formed, wherein the negative pole body under the negative pole recess thereof has a blind hole from a bottom thereof.

2. The base of LED as defined in claim 1, wherein a material used by the negative pole plate and a material used by the positive pole plate are related to each other.

3. The base of LED as defined in claim 1, wherein an integral piece is formed for the negative pole seat and the positive pole seat and the integral piece is cut to separate the negative pole seat from the positive pole seat.

4. The base of LED as defined in claim 1, wherein the negative pole body and the positive pole body at a respective bottom thereof are higher than the negative pole plate and the positive pole plate at a respective bottom thereof.

5. The base of LED as defined in claim 1, wherein the negative pole body and the positive pole body at a respective side opposite to each other has one of a flat shape and a curvy shape.

6. The base of LED as defined in claim 1, wherein the negative pole body and the positive pole body are fabricated by a method selected from the group consisting of pressing, free waxing, casting, etching, powder metallurgy, die casting, extruding, forging, stamping and pre-cast forming.

7. The base of LED as defined in claim 1, wherein the negative pole body and the positive pole body is made of a metal selected from the group consisting of copper, iron, and aluminum.

* * * * *